United States Patent
Chidambarrao et al.

(10) Patent No.: US 7,550,364 B2
(45) Date of Patent: Jun. 23, 2009

(54) STRESS ENGINEERING USING DUAL PAD NITRIDE WITH SELECTIVE SOI DEVICE ARCHITECTURE

(75) Inventors: Dureseti Chidambarrao, Weston, CT (US); William K. Henson, Poughkeepsie, NY (US); Kern Rim, Yorktown Heights, NY (US); William C. Wille, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/668,790

(22) Filed: Jan. 30, 2007

(65) Prior Publication Data
US 2007/0122965 A1 May 31, 2007

Related U.S. Application Data

(62) Division of application No. 11/162,953, filed on Sep. 29, 2005, now Pat. No. 7,202,513.

(51) Int. Cl.
*H01L 21/76* (2006.01)
(52) U.S. Cl. .................... 438/426; 257/347
(58) Field of Classification Search .......... 438/197, 438/219, 228, 231, 424–426, 938, 275, 296, 438/297, 439; 257/E29.193, 18, 19, 275, 257/347, 618, E21.32, E21.112, E21.561, 257/E21.564
See application file for complete search history.

(56) References Cited

U.S. PATENT DOCUMENTS 3,602,841 A 8/1971 McGroddy
4,665,415 A 5/1987 Esaki et al.
4,853,076 A 8/1989 Tsaur et al.
4,855,245 A 8/1989 Neppl et al.
4,952,524 A 8/1990 Lee et al.
4,958,213 A 9/1990 Eklund et al.
5,006,913 A 4/1991 Sugahara et al.
5,060,030 A 10/1991 Hoke
5,081,513 A 1/1992 Jackson et al.

(Continued)

FOREIGN PATENT DOCUMENTS

| CN | 1540757 A | 10/2004 |
|---|---|---|
| EP | 01/62362 | 6/1989 |
| EP | 0 967 636 A2 | 12/1999 |
| EP | 1 174 928 A1 | 1/2002 |
| WO | WO 94/27317 | 5/1993 |
| WO | WO 02/44156 A2 | 6/2002 |

OTHER PUBLICATIONS

Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—David Vu
*Assistant Examiner*—Suberr Chi
(74) *Attorney, Agent, or Firm*—Scully, Scott, Murphy & Presser, P.C.; H. Daniel Schnurmann

(57) ABSTRACT

A method for engineering stress in the channels of MOS transistors of different conductivity using highly stressed nitride films in combination with selective semiconductor-on-insulator (SOI) device architecture is described. A method of using compressive and tensile nitride films in the shallow trench isolation (STI) process is described. High values of stress are achieved when the method is applied to a selective SOI architecture.

16 Claims, 4 Drawing Sheets

U.S. PATENT DOCUMENTS

| | | | |
|---|---|---|---|
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy et al. |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,110,769 A | 8/2000 | Son |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,326,667 B1 | 12/2001 | Sugiyama et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | Von Ehrenwall |
| 6,476,462 B2 | 11/2002 | Shimizu et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,603,156 B2 | 8/2003 | Rim |
| 6,767,802 B1 | 7/2004 | Maa et al. |
| 6,774,015 B1 | 8/2004 | Cohen et al. |
| 6,815,278 B1 | 11/2004 | Ieong et al. |
| 6,815,738 B2 | 11/2004 | Rim |
| 6,828,214 B2 | 12/2004 | Notsu |
| 6,828,628 B2 | 12/2004 | Hergenrother et al. |
| 6,831,292 B2 | 12/2004 | Currie et al. |
| 6,900,502 B2* | 5/2005 | Ge et al. ............... 257/347 |
| 6,936,522 B2* | 8/2005 | Steegen et al. ............ 438/426 |
| 6,958,516 B2* | 10/2005 | Wong ..................... 257/347 |
| 7,005,302 B2 | 2/2006 | Xiang |
| 2001/0009784 A1 | 7/2001 | Ma et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0113217 A1* | 6/2004 | Chidambarrao et al. ..... 257/415 |
| 2004/0175872 A1* | 9/2004 | Yeo et al. ............... 438/154 |
| 2005/0151193 A1 | 7/2005 | Wong |
| 2006/0125008 A1* | 6/2006 | Chidambarrao et al. ..... 257/347 |
| 2007/0015347 A1* | 1/2007 | Mehta et al. ............ 438/514 |
| 2007/0059875 A1* | 3/2007 | Mishima ................ 438/199 |

OTHER PUBLICATIONS

Rim, et al. "Characteristics and Device Design of Sub-100 nm Strained Si N- and PMOSFETs", 2002 Symposium On VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC) : A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp. 151-154, 2000 IEEE.

Sayama et al., "Effect of <Channel Direction for High Performance SCE Immune pMOSFET with Less Than 0.15um Gate Length" ULSI Development Center, pp. 27.5.1-27.5.4, 1999 IEEE.

Yin, et al., "Fully-depleted Strained-Si on Insulator NMOSFETs without Relaxed SiGe Buffers", IEDM, 2003 IEEE.

Yin, et al., "Strain partition of Si/SiGe and SiO$_2$/SiGe on compliant substrates", Applied Physics Letters, vol. 82, No. 22, Jun. 2, 2003, pp. 3853-3855.

Huang, et al., "Relaxation of a Strained Elastic Film on a Viscous Layer", Mat. Res. Soc. Symp. Proc., vol. 695, 2002 Materials Research Society; pp. L3.14.1-L3.14.6.

Yin, et al., "Strain relaxation of SiGe islands on compliant oxide", Journal of Applied Physics, vol. 91, No. 12, Jun. 15, 2002, pp. 9716-9722.

"AmberWave and Aixtron to develop CVD equipment for SiGe and strained Si", http://www.compoundsemiconductor.net/articles/news/6/5/13/1, last printed Apr. 28, 2005.

* cited by examiner

STRESS ENGINEERING USING DUAL PAD NITRIDE WITH SELECTIVE SOI DEVICE ARCHITECTURE

RELATED APPLICATIONS

This application is a divisional of U.S. patent application Ser. No. 11/162,953, filed Sep. 29, 2005.

FIELD OF THE INVENTION

The present invention relates to semiconductor device manufacturing, and more particularly to a method for engineering stress in channel regions of metal-oxide-semiconductor (MOS) devices of different conductivities using highly stressed nitride films in combination with a selective semiconductor-on-insulator (SOI) device architecture. Specifically, the inventive method uses compressive and tensile nitride films as the dual pad nitride in a shallow trench isolation (STI) process to induce stress in the channel regions of MOS transistors. High values of stress are achieved when the inventive method is applied to a selective SOI device architecture. The present invention also relates to the semiconductor structure that is manufactured utilizing the method of the present application.

BACKGROUND OF THE INVENTION

Conventional gate length and gate dielectric scaling of complementary metal oxide semiconductor (CMOS) technology no longer produces the desired improvements in device performance. Parasitic resistances and capacitances are becoming a fundamental limiting factor to improving device performance with each new technology node. New materials and device architectures are thus required in order to overcome these fundamental scaling obstacles that degrade device performance.

One approach to overcome these effects is to increase the drive current of the metal-oxide-semiconductor field effect transistor (MOSFET) by increasing the mobility of the carriers in the channel. It is well known that the application of mechanical stress can substantially improve or degrade the mobility of electrons and holes in a semiconductor; however, it is also known that electrons and holes respond differently to the same type of stress. For example, the application of compressive stress in the longitudinal direction of current flow is beneficial for hole mobility, but detrimental for electron mobility. The application of tensile stress in the longitudinal direction is beneficial for electrons, but detrimental for holes.

State of the art technology currently uses stress nitride liners that are deposited after silicidation to apply longitudinal stress to the channel and therefore increase the current drive of CMOS devices. However, it is imperative to develop an integration scheme that allows the desired application of stress (compressive or tensile) on the appropriate devices (nFETs or pFETs) to maximize performance of CMOS technology. Unfortunately, the use of stress liners appears to be approaching limitations in the magnitude of stress that can be applied to the channel of CMOS devices.

In view of the above, there is a need for providing an alternative method to achieve higher magnitudes of stress in the channel (and therefore higher mobility) with the desired type of stress (compressive for pFET and tensile for nFET).

SUMMARY OF THE INVENTION

The present invention provides a method for engineering stress in channel regions of MOS transistors of different conductivity using highly stressed nitride films in conjunction with a selective semiconductor-on-insulator (SOI) device architecture, More particularly, the present invention provides a. method of using compressive and tensile nitride films as a dual pad nitride in a shallow trench isolation (STI) process. High values of stress are achieved when the method of the present invention is applied to a selective SOI device architecture. By "high values of stress" it is meant that stress values in the channel on the order of about 500 MPa or greater can be achieved utilizing the method of the present invention. More typically, the inventive method provides a stress range within the device channel from about 600 to about 700 MPa. The inventive method can be applied to a selective SOI device architecture that includes at least one nFET device region and at least one pFET device region.

In accordance with the present invention, high values of stress can be introduced into the channel regions of MOS devices utilizing the method of the present invention in which dual stress nitride films are employed as a pad nitride film in the MOS isolation process (e.g., STI process) in conjunction with a selective SOI device architecture. Dual stress nitride liner means that both tensile and compressive nitride films are deposited on the wafer covering the desired device regions (i.e., nFET region or pFET region). The use of the highly stressed nitride films as the pad nitride film of the isolation process does not incorporate much strain in a conventional bulk silicon wafer, which is why the selective SOI architecture is important.

The term "selective SOI architecture" is used herein to denote an SOI substrate including a top Si-containing semiconductor layer and a bottom Si-containing semiconductor layer, wherein portions of the top Si-containing semiconductor layer are separated from the Si-containing semiconductor layer by discrete buried oxide regions. In accordance with the present invention, the discrete buried oxides are present only beneath areas in which the source/drain junctions of the MOS device will eventually be present; no discrete buried oxide regions are present below the channel region of the MOS device.

A selective SOI architecture is formed by first providing a lateral void underneath the junctions of the device, which will maintain stress induced thereon and will be eventually filled with an oxide forming a buried oxide region of the structure. The lateral void underneath creates a free surface at the perimeter of the device. The free surface surrounding the perimeter of the device allows the Si-containing material at the surface to bend when a mechanical stress is applied, The tensile nitride film applies a lateral force that pulls the edges of the Si-containing material towards the center. As a result of the tensile force from the pad nitride, the Si-containing material bends up at the perimeter creating compressive strain in the center of the Si-containing channel. When compressive nitride is used as the pad nitride, the compressive nitride film applies a force in the opposite direction of the tensile film and as a result the Si-containing material bends down at the edges creating a tensile strain at the center of the Si-containing channel. Therefore a compressive pad nitride is used for nFET devices and a tensile pad nitride for the pFET devices in order to achieve the desired type of stress on nFETs and pFETs. In addition, the dual stress pad nitride must be applied on a substrate that subsequently will have a selective SOI architecture in order to achieve the high levels of stress that are necessary for the desired increase in drive current.

In general terms, the method of the present invention comprises:

providing a Si-containing structure having at least one first device region and at least one second device region, said structure including discrete n-doped regions therein;

forming a first material stack comprising a first pad oxide and a patterned first nitride film having a first stress, wherein said patterned nitride film is located over one of said device regions;

forming a second material stack comprising a second pad oxide and a patterned second nitride film having a second stress which is of a different stress type as the first stress, wherein said patterned second nitride film is located over one of said device regions not including said patterned first nitride film;

forming a trench into said first and second material stacks between said first and second device regions that extends down though at least one of said n-doped regions;

laterally etching said n-doped regions to create voids on each side of the trench which maintain stress of said overlying nitride films; and filling said voids and trench with an oxide.

Following the filling step, the various layers of the first and stack material stacks can be removed from the structure and nFET and pFET devices can be formed. In accordance with the present invention, the pFETs are formed over a portion of the structure that is under compressive stress, whereas the nFETs are formed over a portion of the structure that is under tensile stress. The structure has a selective SOI architecture such that the junctions of the nFETs and pFETs are located above the filled voids, while the device channels are not.

In addition to the method described above, the present invention also provides a semiconductor structure that includes stress channel regions whose stress is within the ranges mentioned above. The semiconductor structure of the present invention comprises:

a selective SOI substrate including top and bottom Si-containing layers which are separated in predetermined regions by discrete buried oxide regions;

at least one nFET including source/drain diffusion regions and a tensile strained channel located on a portion of said substrate; and at least one pFET including source/drain diffusion regions and a compressive strained channel located on other portions of said substrate, wherein said source/drain diffusion regions of said at least one nFET and said at least one pFET are located above said discrete buried oxide regions and said strained channels are not located above said discrete buried oxide regions.

DETAILED DESCRIPTION OF THE INVENTION

The present invention, which provides a method for engineering stress in the channel regions of MOS transistors of different conductivities as well as the structure formed utilizing the same, will now be described in greater detail by referring to the following description and drawings that accompany the present application. It is noted that the drawings of the present application are provided for illustrative purposes and, as such, they are not drawn to scale.

In accordance with the present invention, there are two key features that enable a large amount of stress to be applied to the channel of MOS devices: (1) the use of dual stress nitride films as the pad nitride in the STI isolation process and, (2) the dual nitride isolation process must be applied to a structure that will subsequently have a selective SOI device architecture. Dual stress nitride liner means that both tensile and compressive nitride films are deposited on the wafer covering the desired device regions (nFET or pFET). The use of the highly stressed nitride films as the pad nitride of the STI process does not incorporate much strain in the silicon on standard bulk silicon wafers which is why the selective SOI architecture is important. A selective SOI architecture allows the formation of a lateral void underneath the areas of the Si-containing material that will eventually include the S/D junctions of the device. The lateral void underneath creates a free surface at the perimeter of the device. The free surface surrounding the perimeter of the device allows the Si-containing material at the surface to bend when a mechanical stress is applied. These lateral voids, which extend from bottom edges of isolation trenches, maintain the stress induced by overlying stressed nitride layers. Moreover, these voids are subsequently filled with an oxide forming buried oxide regions of the selective SOI substrate. The oxide filled voids are in contact with oxide filled trench isolation regions.

Figure 1:
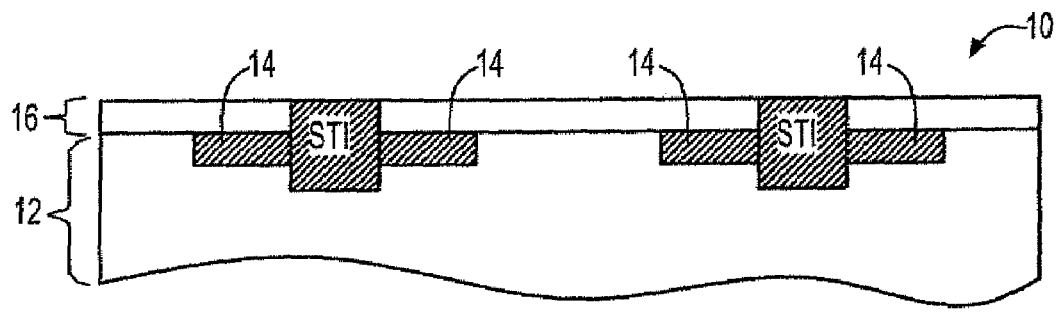
FIG. 1 is a pictorial representation (through a cross sectional view) depicting the selective SOI architecture utilized in the present invention.

FIG. 1 illustrates the selective SOI architecture used in the present invention. Specifically, the SOI architecture 10 comprises a top Si-containing semiconductor layer 16 and a bottom Si-containing semiconductor layer 12, wherein portions of the top Si-containing semiconductor layer 16 are separated from the Si-containing semiconductor layer 12 by discrete buried oxide regions 14. In accordance with the present invention, the discrete buried oxide regions 14 are present underneath areas of the top Si-containing semiconductor layer that will subsequently receive the source/drain junctions of a MOS transistor. No discrete buried oxide is present underneath areas of the top Si-containing semiconductor layer in which the MOS channel will be present. The selective SOI architecture used in the present invention has been described previously in co-pending and co-assigned U.S patent application Ser. Nos. 10/604,102, filed Jun. 26, 2003 and Ser. No. 10/754, 320, filed Jan. 8, 2004, the entire contents of which are both incorporated herein by reference. Note that FIG. 1 also shows the presence of trench isolation regions which are labeled as STI.

The term "Si-containing semiconductor" is used throughout the instant application to denote any semiconductor material that includes silicon. Illustrative examples of such Si-containing semiconductor materials include, but are not limited to: Si, SiGe, SiGeC, SiC, Si/Si, Si/SiC, Si/SiGe and Si/SiGeC. Preferably, both Si-containing layers 12 and 16 are comprised of Si. The Si-containing layers 12 and 16 may be doped or undoped.

The top Si-containing layer 16 of the SOI substrate 10 typically has a thickness from about 50 to about 200 nm, with a thickness from about 75 to about 100 nm being more typical. The thickness of the bottom Si-containing layer 12 is typically from about 500 to about 750 μm. The discrete buried oxide regions 14 can be a crystalline or non-crystalline oxide, which typically have a thickness from about 30 to about 100 nm.

Figure 2A:
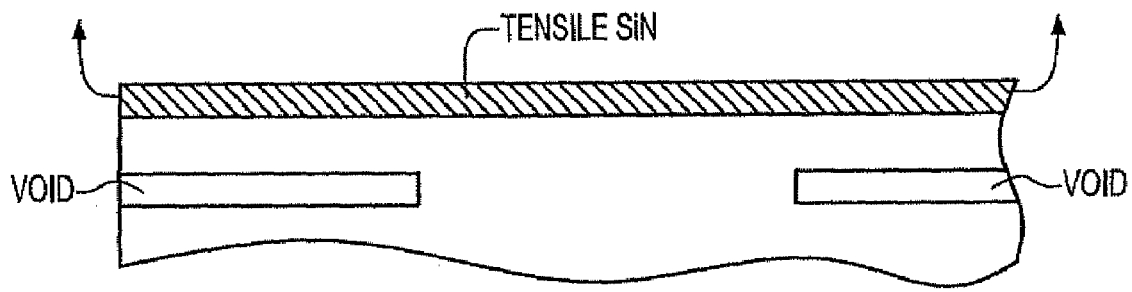
FIGS. 2A-2B are pictorial representations (through cross sectional views) depicting the selective SOI architecture with a tensile silicon nitride, SiN, layer (FIG. 2A) and a compressive SiN layer (FIG. 2B).
Figure 2B:
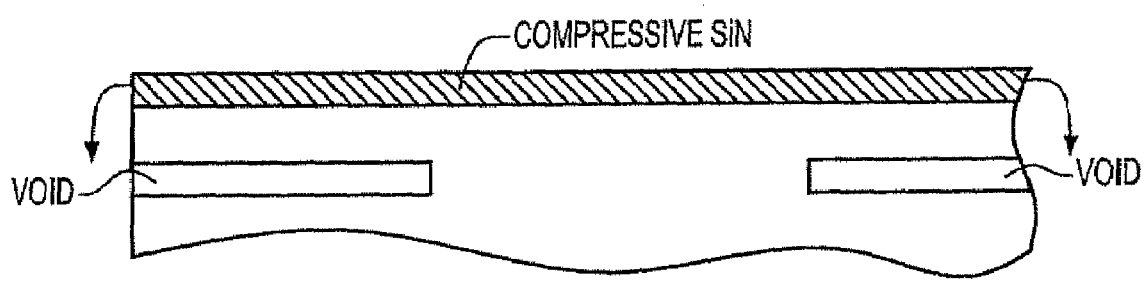

FIG. 2A illustrates how the Si-containing material bends when a film with high tensile stress (stress >1 GPa) is present on the surface. The tensile nitride film applies a lateral force that pulls the edges of the Si-containing material towards the center. As a result of the tensile force from the pad nitride, the Si-containing material bends up at the perimeter creating compressive strain in the center of the Si-containing material channel. FIG. 2B illustrates the example when compressive nitride is used as the pad nitride. The compressive nitride film applies a force in the opposite direction of the tensile film and as a result the Si-containing material bends down at the edges creating a tensile strain at the center of the Si-containing material channel. Therefore a compressive pad nitride must be used for nFET devices and tensile pad nitride for the pFET devices in order to achieve the desired type of stress on nFETs and pFETs. In addition, the dual stress pad nitrides must be applied on a substrate, e.g., structure, that will eventually have a selective SOI architecture in order to achieve the high levels of stress that are necessary for the desired increase in drive current.

Figure 3:
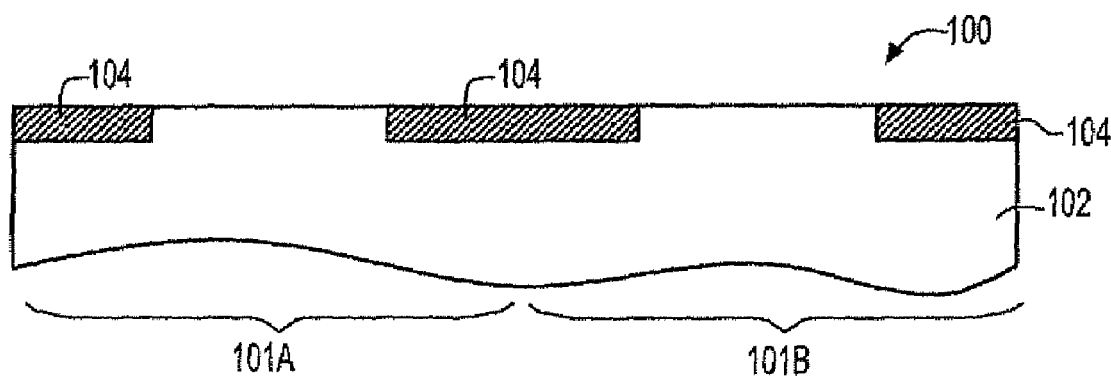
FIGS. 3-11 are pictorial representations (through cross sectional views) depicting the basic process steps of the present invention.

Reference is now made to FIGS. 3-11 which illustrate in cross sectional view the basic processing steps of the present invention. Specifically, FIG. 3 illustrates an initial structure 100 that is employed in fabricating the inventive structure. As shown, the initial structure 100 includes a bulk Si-containing substrate 102 having n-doped regions 104 formed therein. The initial structure also includes a first device region 101A and a second device region 101B. The first device region 101A is the area in which either an nFET or a pFET will be formed, while the second device area 101B is the area in which the opposite conductivity type FET, as compared to the FET in the first device region, will be subsequently formed.

The n-doped regions 104 are areas in which the buried insulator 14 of the SOI substrate 10 will be subsequently formed. The n-doped regions 104 are typically formed at, or near, the upper surface of the bulk Si-containing substrate 100. By "near" it is meant that the n-doped regions 104 have an upper surface that is within about 50 nm or less from the upper surface of the bulk Si-containing substrate 102.

The n-doped regions 104 are formed utilizing a masked ion implantation process. Later in the process flow the n-doped regions 104 will be etched away selectively to the undoped regions forming voids; the voids will help to maintain stress induced by an overlying stressed nitride film and will be filled with an oxide forming discrete buried oxide regions of the selective SOI substrate. The implant species employed in forming the n-doped regions 104 are typically As, P or Sb. Implant energies used in forming the n-doped regions 104 typically range from about 5 keV to about 20 keV and ion doses from about 5E14 to about 2E15 atoms/cm$^2$ are typically used. Annealing may follow the implantation to cause activation and diffusion of the n-type dopants. The bulk Si-containing substrate 102 will become the bottom Si-containing layer 12 of the selective SOI substrate 10 shown in FIG. 1.

Figure 4:
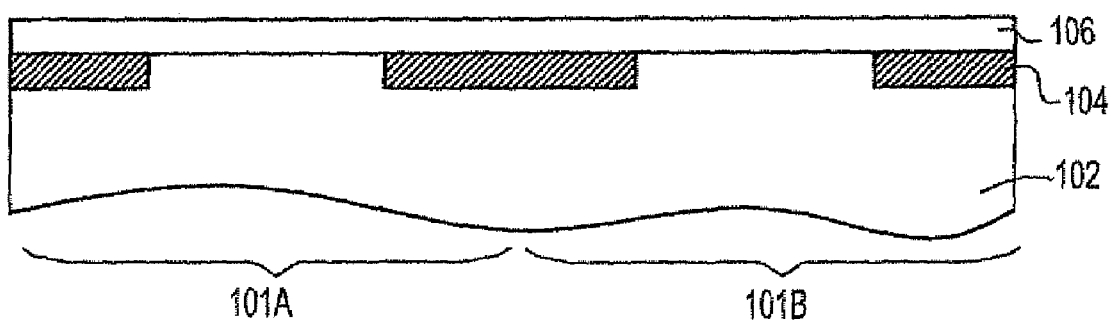

FIG. 4 shows the structure after a Si-containing layer 106 is formed atop the initial structure 100. The Si-containing layer 106, which serves as the top Si-containing layer 16 of the selective SOI substrate 10 shown in FIG. 1, is formed by an epitaxial growth process. The thickness of the Si-containing layer 106 may vary depending upon the desired thickness of the SOI layer and the depth of the source/drain junctions to be subsequently formed. Typically, the thickness of the Si-containing layer 106 is from about 5 to about 100 nm.

Next, a first material stack 108 comprising a first pad oxide 110 and a first nitride film 112 having a first stress (either tensile or compressive) is formed over the structure shown in FIG. 4. In accordance with the present invention, the first pad oxide 110 is located underneath the first nitride film 112 on a surface of the Si-containing layer 106. The first pad oxide 110 is formed by a conventional thermal oxidation process or by a conventional deposition process such as, for example, chemical vapor deposition, plasma enhanced chemical vapor deposition, evaporation, chemical solution deposition and atomic layer deposition. The first pad oxide 110 typically has a thickness from about 2 to about 10 nm. The first nitride film 112 having the first stress is formed utilizing a conventional deposition process such as, for example, chemical vapor deposition (CVD) or plasma enhanced chemical vapor deposition (PECVD). The thickness of the first nitride film 112 having the first stress is typically from about 30 to about 100 nm.

Figure 5:
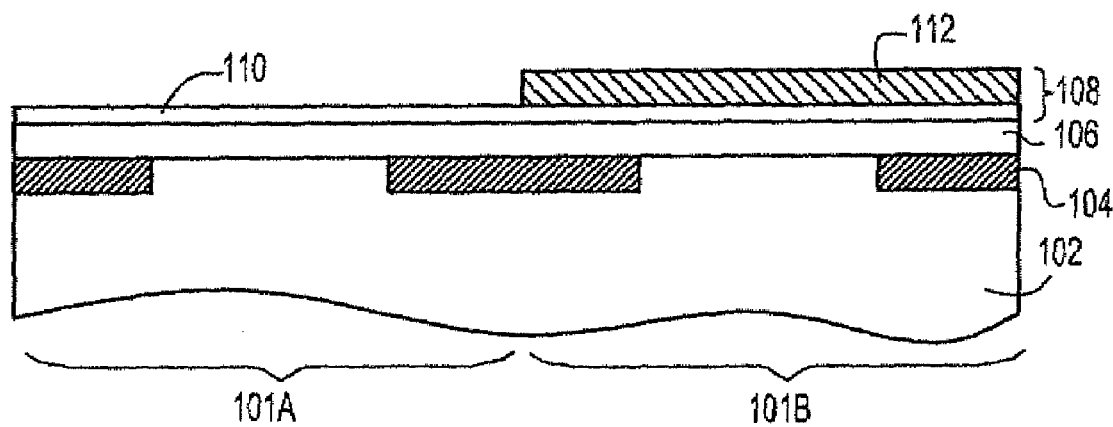

The first nitride film 112 having the first stress is then selectively etched away from one of the device areas such that the remaining first nitride film 112 is present in a device area which will have the greatest impact on the drive current of the MOS device to be subsequently formed therein. Thus, for example, if a tensile SiN film is used as film 112, the selective etching process removes the tensile SiN film from the device region(s) where nFET devices will be subsequently formed. If a compressive film is used as film 112, the compressive SiN film is selectively removed from the device region(s) where pFET devices will be subsequently formed. The selectively etching is achieved by first applying a photoresist to the upper surface of film 112, and then forming a pattern into the photoresist utilizing a conventional photolithography process (i.e., exposing the photoresist to a pattern of radiation and developing the exposed photoresist utilizing a conventional resist developer). After photolithography, an etching process that removes nitride selective to oxide is performed. The etching process may include any dry etching technique such as, reactive-ion etching, plasma etching, ion beam etching or laser ablation. Alternatively, a wet etch technique utilizing a chemical etchant can also be used. The resultant structure, in one embodiment of the present invention, including the patterned first nitride film 112 atop the unpatterned pad oxide 110 is shown in FIG. 5. Although the patterned first nitride film 112 is shown over the second device region 101B, the present invention also contemplates the case when the patterned first nitride film 112 is located only over the first device region 101A.

Next, a second material layer 114 including a second pad oxide 116 and a second nitride film 118 having a second stress that is of a different stress type than the first nitride film 112 is formed on the structure shown in FIG. 5. The second pad oxide 116 forms atop exposed surfaces of the first pad oxide 110 and the patterned nitride film 112. The second pad oxide 116 is used to protect the first nitride film 112 during the subsequent patterning of the second nitride film 118. The processing and thickness of the second pad oxide 116 and the second nitride film 118 are similar to those reported above for the first pad oxide 110 and the first nitride film 112. The structure including the second material layer 114 is shown in FIG. 6.

Figure 6:
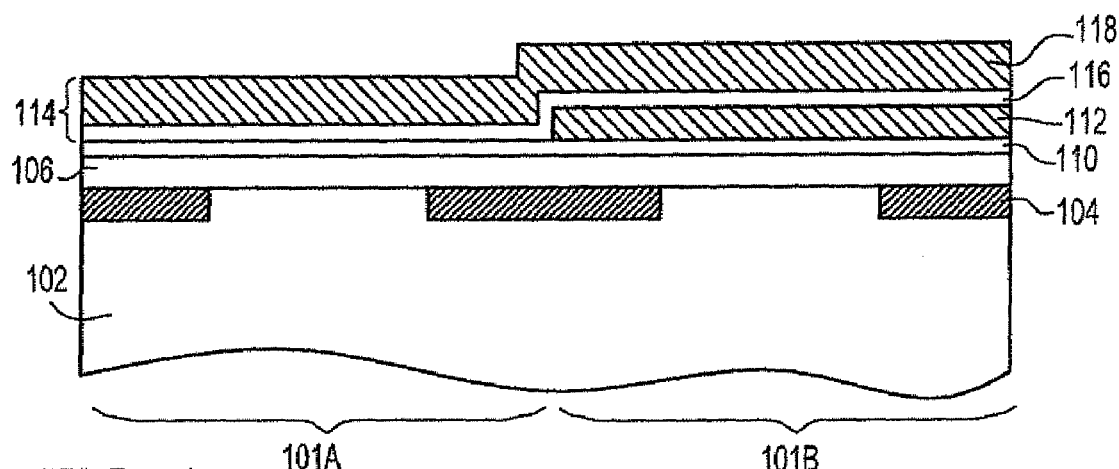
Figure 7:
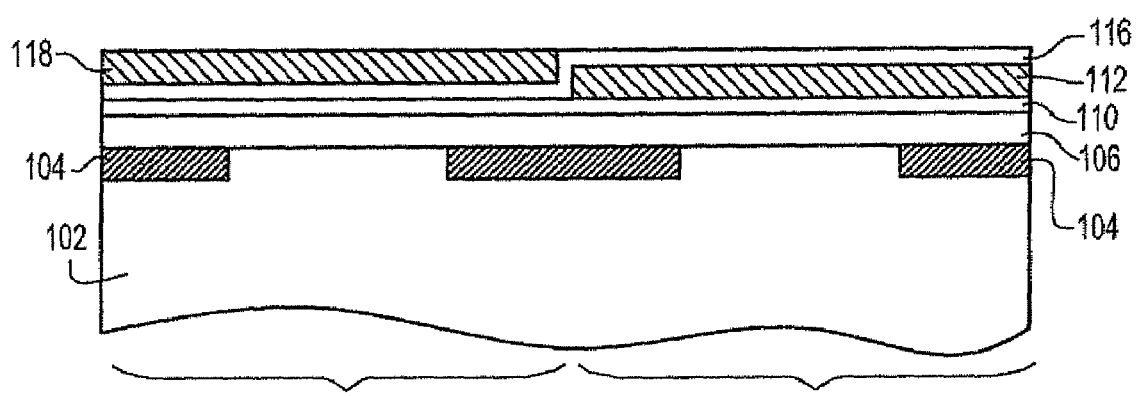

The structure illustrated in FIG. 6 is then patterned (as described above) to remove the second nitride film 118 from the area of the structure that previously included the first nitride film 112. This structure is shown in FIG. 7. As shown, the first device region 101A includes, for example, only the second nitride film 118, while the second device region 101B includes only the first nitride film 112. The location of the first and second nitride films can be switched depending on the type of device which will be subsequently formed in the specific area. In one embodiment, the first device region 101A is an nFET device region which is covered with a compressive nitride film 118, while the second device region 101B is a pFET device region that is covered with a tensile nitride film 112. In another embodiment, the first device region 101A is a pFET device region which is covered with a tensile nitride film 118, while the second device region 101B is an nFET device region that is covered with a compressive nitride film 112. It is again emphasized that the compressive film causes a channel to be under tensile strain, whereas a tensile film causes a channel to be under compressive strain.

Figure 8:
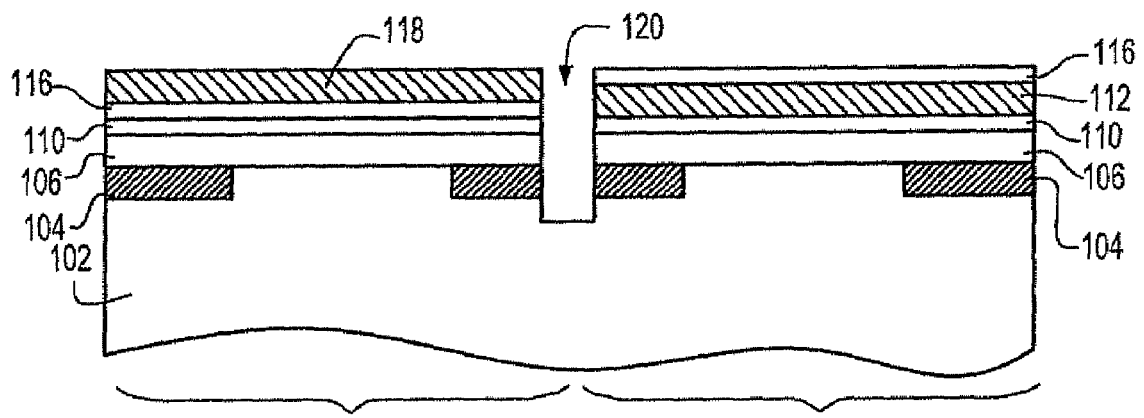

FIG. 8 shows the structure after forming at least one trench opening 120 into the structure shown in FIG. 7. As shown, the trench opening 120 is formed between the first and second device regions (101A and 101B, respectively) extending down and through at least one of the non-doped regions 104. The trench opening 120 is formed by lithography and etching. The etching process may comprise a single etch (wet or dry) or a combination thereof.

Figure 9:
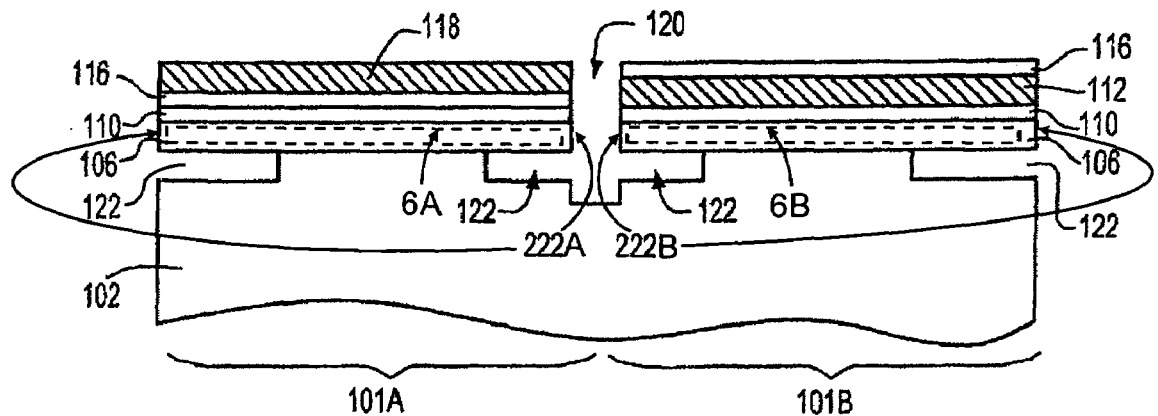

FIG. 9 shows the structure that is formed after performing a lateral etching process which is capable of removing the n-doped regions 104 from the structure forming voids 122 in the Si-containing material. This step is critical for creating stress in the Si-containing material located above the voids. The lateral etch is performed utilizing any etching process that is selective in removing the n-doped regions 104 as compared with the undoped semiconductor regions. For example, a dry etch in chlorine, i.e., $Cl_2$, can be used in this step of the present invention.

The lateral void 112 underneath creates a free surface at the perimeter (222A or 222B) of a Si-containing portion (6A or 6B). The free surface surrounding the perimeter (222A or 222B) of the Si-containing portion (6A or 6B) allows the Si-containing material at the surface to bend when a mechanical stress is applied. The tensile nitride film (112 or 116) applies a lateral force that pulls the edges of the Si-containing material towards the center. As a result of the tensile force from the pad nitride, the Si-containing material bends up at the perimeter creating compressive strain in the center of the Si-containing channel. When compressive nitride (116 or 112) is used as the pad nitride, the compressive nitride film applies a force in the opposite direction of the tensile film and as a result the Si-containing material bends down at the edges creating a tensile strain at the center of the Si-containing channel. Therefore a compressive pad nitride (112 or 116) is used for nFET devices and a tensile pad nitride (116 or 112) for the pFET devices in order to achieve the desired type of stress on nFETs and pFETs. It is noted that after the lateral etch, the Si-containing material near the surface is free to bend due to force applied from the tensile and compressive silicon nitride films, as described above in connection with FIGS. 2A and 2B. As a result, the Si-containing material in the channel region is highly strained (i.e., the Si-containing material under the tensile strained silicon nitride film is under compressive strain, while the Si-containing material under the compressively strained silicon nitride film is under tensile strain).

Figure 10:
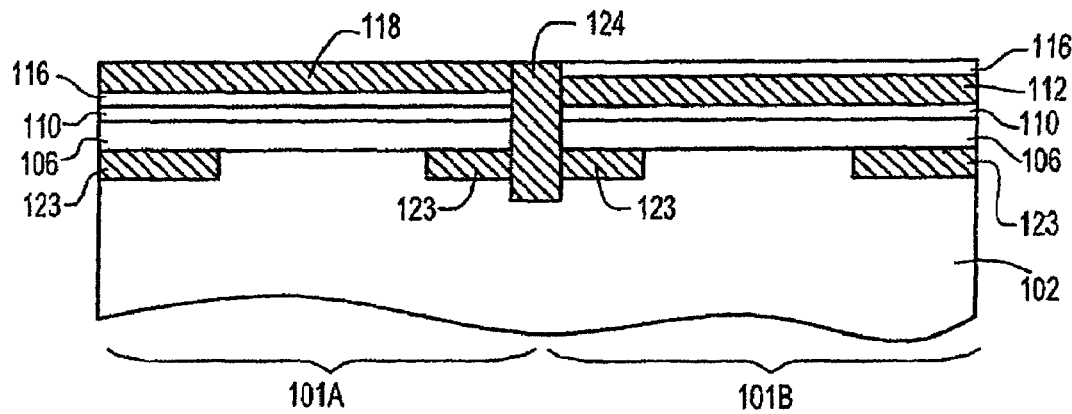
Figure 11:
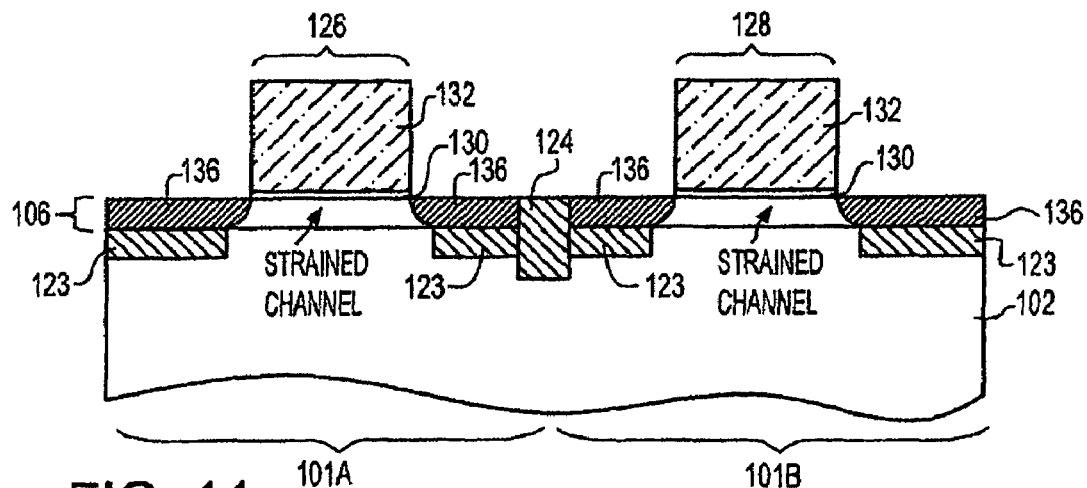

Next, and as shown in FIG. 10, the at least one trench opening 120 and the voids 122 created by the lateral etching process mentioned above are filled with an oxide utilizing a conventional deposition process such as, for example, plasma-assisted chemical vapor deposition. Note that the oxide filled voids 123, which are connected to trench isolation regions 124, form the discrete and buried oxide regions 14 shown in FIG. 1. After deposition, a planarization process such as, for example, chemical mechanical polishing (CMP) and/or grinding is used to complete the formation of trench isolation regions 124. One key aspect to mention is than the strain in the Si-containing channels created by the nitride films will be retained in the Si-containing material because of the oxide fill.

The structure shown in FIG. 10 is then subjected to another planarization process which removes any remaining pad oxide and nitride films from the structure and thereafter MOS devices are formed on the surface of the planarized structure utilizing a conventional CMOS process. This step of the present invention provides the structure illustrated in FIG. 11 wherein a first FET 126 of a first conductivity type is formed in the first device region 101A and a second FET 128 of a second conductivity type that is different from the first conductivity type is formed in the second device region 101B. Specifically, an nFET is formed in the region that is under tensile strain, while a pFET is formed in the region under compressive strain.

As stated above, the FETs are formed utilizing conventional complementary metal oxide semiconductor (CMOS) processing steps that are well known to those skilled in the art. For example, each FET can be formed by first forming a layer of gate dielectric 130 on an upper surface of the top Si-containing layer of the SOI substrate. The term "gate dielectric" is used in the present invention to denote any insulating material, such as an oxide, nitride or oxynitride, that is typically employed as the gate dielectric of an MOSFET. The gate dielectric 130 is formed by a conventional deposition process such as, for example, chemical vapor deposition (CVD), plasma-assisted CVD, atomic layer deposition, physical vapor deposition or another like deposition process. Alternatively, the gate dielectric 130 can be formed by a thermal oxidation, nitridation or oxynitridation process. The thickness of the gate dielectric 130 is typically from about 1 to about 10 nm.

After formation of the gate dielectric, a gate conductor 132 is formed atop the gate dielectric. The gate conductor 132 may include any conductive material, including for example, doped polysilicon, conductive elemental metals, alloys of conductive elemental metals, silicides of conductive elemental metals, nitrides of conductive elemental metals, or any combination thereof. A diffusion barrier and/or a dielectric cap may be formed within or atop the gate conductor 132. Gate conductor 132 can be formed by a conventional deposition process such as, for example, CVD, plasma-assisted CVD, evaporation, sputtering, plating or another like deposition process. When polysilicon is employed, the polysilicon gate conductor is a doped material that can be formed in-situ, or by deposition and then ion implantation. The thickness of the gate conductor 132 is typically from about 100 to about 300 nm.

It is noted that the gate dielectric and the gate conductor of the FETs of different conductivities may be comprised of the same materials, or different gate dielectrics and/or gate conductors may be used.

Following formation of the gate conductor, the gate conductor and typically, the gate dielectric are patterned by lithography and etching. Next, insulating spacers (not shown) are typically formed (by deposition and etching) on the exposed sidewalls of at least the patterned gate conductor. Following spacer formation, the source/drain diffusion regions 134 are formed into the top Si-containing layer of the SOI substrate by ion implantation and annealing. As shown, the source/drain regions 134 are located above the oxide filled void regions (e.g., the buried oxide regions) of the SOI structure.

The annealing causes diffusion of the implanted dopants. The extent of the diffusion determines the length of the channel regions in the top Si-containing layer of the SOI substrate. The channel regions 136 are positioned such that no buried oxide is positioned there below.

It should be emphasized that the channel regions 136 are stressed without the need of using a conventional stress liner and/or embedded stress regions. As stated above, high stressed channel are formed into the Si-containing material by providing lateral voids in a structure that includes dual stress nitride pad films. These pad films, which are used in forming the STI region are removed from the structure and then CMOS devices are formed thereon.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method of fabricating a semiconductor structure comprising:
   forming an n-doped region in a bulk Si-containing substrate, wherein said n-doped region extends from a portion of a first device region to a portion of a second device region within said bulk-Si containing substrate;
   forming a Si-containing layer directly on an upper surface of said bulk Si-containing substrate, wherein said Si-containing layer includes a first Si-containing portion located in said first device region and a second Si-containing portion located in said second device region;
   forming a contiguous material stack including a first material stack portion located over said first device region and a second material stack portion located over said second device region, wherein said first material stack portion includes a tensile nitride film, and wherein said second material stack portion includes a compressive nitride film;
   separating a first stack of said first material stack portion and said first Si-containing portion from a second stack of said second material stack portion and said second Si-containing portion by forming a trench into said first and second material stacks between said first and second device regions which extends down through said n-doped region and laterally etching said n-doped region to create voids on each side of the trench, wherein said tensile nitride film generates a compressive strain within said first device region as a free surface surrounding a perimeter of said first Si-containing portion in said first device region is formed within said voids, and wherein said compressive nitride film generates a tensile strain within said second device region as a free surface surrounding a perimeter of said second Si-containing portion in said second device region is formed within said voids;
   filling said voids and said trench with an oxide; and
   removing one of said tensile nitride film or compressive nitride film from said second device region.

2. The method of claim 1 wherein said n-doped region is formed by implanting n-type dopants into said bulk Si-containing substrate at or near a surface thereof.

3. The method of claim 2 wherein said implanting comprises a masked ion implantation process wherein As, P or Sb ions are used as said n-type dopants.

4. The method of claim 2 wherein said implanting is performed at an energy from about 5 to about 20 keV and ion doses from about 5E 14 to about 2E 15 atoms/cm$^2$ are used.

5. The method of claim 1 wherein said n-doped region is located directly beneath or within 50 nm of an upper surface of said bulk Si-containing substrate.

6. The method of claim 1 further comprising:
   forming a pFET in said first device region; and
   forming an nFET in said second device region.

7. The method of claim 6 further comprising removing an entirety of said contiguous material stack.

8. The method of claim 1 further comprising:
   forming a first pad oxide directly on said Si-containing layer; and
   forming said tensile nitride film directly on said first pad oxide.

9. A method of fabricating a semiconductor structure comprising:
   forming an n-doped region in a bulk Si-containing substrate, wherein said n-doped region extends from a portion of a first device region to a portion of a second device region within said bulk-Si containing substrate;
   forming a first pad oxide directly on said Si-containing layer;
   forming a Si-containing layer directly on an upper surface of said bulk Si-containing substrate, wherein said Si-containing layer includes a first Si-containing portion located in said first device region and a second Si-containing portion located in said second device region;
   forming a contiguous material stack including a first material stack portion located over said first device region and a second material stack portion located over said second device region, wherein said first material stack portion includes a tensile nitride film, and wherein said second material stack portion includes a compressive nitride film;
   separating a first stack of said first material stack portion and said first Si-containing portion from a second stack of said second material stack portion and said second Si-containing portion by forming a trench into said first and second material stacks between said first and second device regions which extends down through said n-doped region and laterally etching said n-doped region to create voids on each side of the trench, wherein said tensile nitride film generates a compressive strain within said first device region as a free surface surrounding a perimeter of said first Si-containing portion in said first device region is formed within said voids, and wherein said compressive nitride film generates a tensile strain within said second device region as a free surface surrounding a perimeter of said second Si-containing portion in said second device region is formed within said voids; and filling said voids and said trench with an oxide; and removing said tensile nitride film from said second device region.

10. The method of claim 9 further comprising:
    forming a second pad oxide directly on said first pad oxide and said tensile nitride film, wherein a vertical portion of said second pad oxide is formed on a sidewall of said tensile nitride film; and
    forming said compressive nitride film directly on said second pad oxide.

11. The method of claim 10 further comprising removing said vertical portion of said second pad oxide during forming of said trench.

12. The method of claim 1 further comprising:
    forming a first pad oxide directly on said Si-containing layer; and forming said compressive nitride film directly on said first pad oxide.

13. A method of fabricating a semiconductor structure comprising:
    forming an n-doped region in a bulk Si-containing substrate, wherein said n-doped region extends from a portion of a first device region to a portion of a second device region within said bulk-Si containing substrate;

forming a first pad oxide directly on said Si-containing layer;

forming a Si-containing layer directly on an upper surface of said bulk Si-containing substrate, wherein said Si-containing layer includes a first Si-containing portion located in said first device region and a second Si-containing portion located in said second device region;

forming a contiguous material stack including a first material stack portion located over said first device region and a second material stack portion located over said second device region, wherein said first material stack portion includes a tensile nitride film, and wherein said second material stack portion includes a compressive nitride film;

separating a first stack of said first material stack portion and said first Si-containing portion from a second stack of said second material stack portion and said second Si-containing portion by forming a trench into said first and second material stacks between said first and second device regions which extends down through said n-doped region and laterally etching said n-doped region to create voids on each side of the trench, wherein said tensile nitride film generates a compressive strain within said first device region as a free surface surrounding a perimeter of said first Si-containing portion in said first device region is formed within said voids, and wherein said compressive nitride film generates a tensile strain within said second device region as a free surface surrounding a perimeter of said second Si-containing portion in said second device region is formed within said voids; and filling said voids and said trench with an oxide; and removing said compressive nitride film nitride film from said second device region.

14. The method of claim 13 further comprising:

forming a second pad oxide directly on said first pad oxide and said compressive nitride film, wherein a vertical portion of said second pad oxide is formed on a sidewall of said compressive nitride film; and forming said tensile nitride film directly on said second pad oxide.

15. The method of claim 14 further comprising removing said vertical portion of said second pad oxide during forming of said trench.

16. The method of claim 1 wherein said a Si-containing layer is formed by epitaxial growth.

* * * * *